United States Patent [19]

Harms et al.

[11] Patent Number: 5,214,382
[45] Date of Patent: May 25, 1993

[54] MAGNETIC RESONANCE IMAGING WITH SELECTIVE CONTRAST ENHANCEMENT

[75] Inventors: Steven E. Harms, Dallas; Duane P. Flamig, Richardson; Richard H. Griffey, Dallas, all of Tex.

[73] Assignee: Baylor Research Institute, Dallas, Tex.

[21] Appl. No.: 685,394

[22] Filed: Apr. 11, 1991

Related U.S. Application Data

[63] Continuation-in-part of Ser. No. 569,100, Aug. 17, 1990, which is a continuation-in-part of Ser. No. 484,119, Feb. 23, 1990, Pat. No. 5,125,407.

[51] Int. Cl.[5] .............................................. G01R 33/20
[52] U.S. Cl. ..................................................... 324/309
[58] Field of Search ................ 324/300, 309, 307, 318, 324/322; 128/653 SC, 653 A, 653.3

[56] References Cited

U.S. PATENT DOCUMENTS 4,901,020  2/1990  Ladebeck ............................. 324/309
5,031,624  7/1991  Mistretta ............................. 128/653.3
5,055,790 10/1991  Siaciak et al. ........................ 324/309

Primary Examiner—Michael J. Tokar
Attorney, Agent, or Firm—Cox & Smith Incorporated

[57] ABSTRACT

A method of producing a selective component enhanced image of an object. A uniform magnetic field is generated to magnetize the object and, once magnetized, a first preparatory pulse sequence which enhances the contrast of a first component of the object with respect to a second component of the object is generated. An RF pulse sequence is generated to produce transverse magnetization in the second component of the object. First, second, and third changing magnetic fields are generated, thereby producing a series of gradient echoes in response to the generated RF pulse sequence. A contrast enhanced image of the object may then be produced from the series of gradient echoes.

4 Claims, 6 Drawing Sheets

MAGNETIC RESONANCE IMAGING WITH SELECTIVE CONTRAST ENHANCEMENT

CROSS REFERENCE TO RELATED APPLICATIONS

This application is a continuation-in-part of U.S. patent application Ser. No. 07/569,100, filed Aug. 17, 1990, pending, which, in turn, is a continuation-in-part of U.S. patent application Ser. No. 07/484,119, filed Feb. 23, 1990, now U.S. Pat. No. 5,125,407, both of which are hereby incorporated by reference as if reproduced in their entirety.

BACKGROUND OF THE INVENTION

1. Field of the Invention

This invention relates to magnetic resonance imaging and, more particularly, to a method for producing a selective contrast enhanced image of an object from a gradient echo pulse sequence produced in response to a preparatory pulse sequence applied prior to the generation of a series of RF and magnetic gradient pulses.

2. Description of Related Art

Magnetism results from the motion of electric charges such as electrons. Electrons can produce a magnetic field either by motion along a path or by virtue of their intrinsic spin. The particles that comprise the atomic nucleus, collectively called nucleons, also have spin and magnetic moment. Because both individual nucleons and nuclei have a charge distribution, rotation or spin of this charge produces a magnetic dipole whose value is called a magnetic moment. The numeric value of the magnetic moment determines the energies of the different orientations of a nucleus in an external magnetic field. The proton is positively charged and has a relatively large magnetic moment. Although neutral, the neutron also has a net magnetic moment. A neutron's magnetic moment is about two-thirds of the value of the proton's and points against the axis of spin. When in the nucleus, like nucleons align with their spins pointing against each other. This phenomena is called "pairing" and is favored because it leads to a lower nuclear energy state. Therefore, only the unpaired, odd proton or neutron, or both, contribute their magnetic moment to the nucleus. As a consequence, only nuclei with odd numbers of protons or neutrons, or both, have a magnetic moment. The magnetic properties of nuclei become important when they are placed in external magnetic fields as the nuclei will have a tendency to align with the external field.

Resonance occurs when an amount of energy equal to the difference of energy associated with the transition between states is absorbed or released. In the case of a magnetic moment of a nucleus, transitions between parallel or "up" and anti-parallel or "down" states can occur if the correct amount of energy is absorbed or released. Because the interaction is with a magnetic element, the necessary energy can be provided by a magnetic field. One way to obtain such a field is by utilizing electromagnetic radiations. To induce resonance, the frequency f of the electromagnetic radiation must be proportional to the local magnetic field $H_L$. The particular proportionality constant which will induce resonance varies depending on the particular nucleus involved. The relationship between frequency and field is given by:

$$f = (\text{gamma}) H_L / 2(\text{pi}) \quad (1)$$

where (gamma) is the magnetogyric ratio of the nucleus.

When the nuclei, originally in equilibrium with the field, are irradiated at the resonant frequency, the nuclei can adopt the anti-parallel state. When the return to equilibrium, if the field is unchanged, they will radiate emissions of the same frequency. If between excitation and radiation the field strength is changed, the nuclei will radiate a frequency corresponding to the new field value. This behavior of nuclei may be described by net magnetization vector N which characterizes the system by disregarding the state of each nucleus and considers only the net collective effect. In a magnetic field, the magnetization vector points along the field. The length of the magnetization vector is proportional to the number of nuclei in the sample and to the field strength and is inversely proportional to temperature. The length and direction of this vector characterizes the equilibrium magnetization of the sample; that is, the state that it will revert to after being disturbed if enough time is allowed to pass. This equilibrium magnetization is given by:

$$(\text{mu})^2 H / kT \quad (2)$$

where:
(mu) is the nuclear magnetic moment;
k is Boltzmann's constant; and
T is the absolute temperature.

This vector can be disturbed from equilibrium by the application of a second external magnetic field. If such a field is superimposed upon the first magnetic field, M will align with the new net field. As M moves to its new direction, energy stored in the nuclei of the sample is provided by the second field. When the superimposed field is removed, M returns to equilibrium and the nuclei release the stored energy to the environment, either as heat or RF energy. These two fields are called the transverse field and the longitudinal field, respectively. More specifically, the component of M that points along the main field is called the longitudinal magnetization ($M_L$) and the orthogonal component is called the transverse magnetization ($M_T$). If the transverse field is an RF field at the resonant frequency, M behaves as a top such that, as it deviates from the longitudinal axis, it precesses about it. If the main magnetic field is defined as being aligned along the z axis, then $M_T$ rotates in the x,y plane and $M_L$ is reduced from its equilibrium value. If M is rotated onto the x,y plane by a 90 degree RF pulse, $M_L$ is 0.

Immediately after an RF irradiation, $M_L$ begins to grow again towards its equilibrium value M. This growth is exponential with a time constant T1 such that:

$$M_L = M[1 - exp(-t \setminus T1)] \quad (3)$$

where t is the time since irradiation.

During this process, $M_T$ decays exponentially with a time constant T2 such that:

$$M_T = M_{T0} exp(-t \setminus T2) \quad (4)$$

where:
$M_{T0}$ is the value of $M_T$ immediately after irradiation; and
t is the lapse time.

When a proton is aligned with the magnetic field, it gives off no signal. When a proton is perpendicular to the field, it gives off a maximum signal. The rate at which a proton realigns with the static field is called its "T1" or "T1 relaxation time". The T1 relaxation time is also called "spin-lattice" or "thermal relaxation time". The individual protons exchange fixed amounts of energy when they flip from the down to up alignment in the process of returning to equilibrium. This exchange can occur only at the resonant frequency. A molecule in the lattice surrounding the resonant nucleus appears as an oscillating electric magnetic field with frequency that depends on its thermal velocity and mean free path. Since both vary over a broad range for any one temperature, of the whole ensemble of molecules, only a small fraction provide the right oscillating fields. These then coupled with the nucleus and allow the relaxation to occur. As temperature and molecular composition changes so does the distribution of velocities and mean free paths, thus affecting T1.

When a group of protons precess in phase, the voxel gives off a maximum signal. When a group of protons precess out of phase, the voxel gives off no signal. The rate at which the protons de-phase is called its "T2" or "T2 relaxation time". The T2 relaxation time is also called the "spin-spin" or "transverse relaxation time". In a perfectly uniform magnetic field, all nuclei will resonate at exactly the same frequency, but if the field is even slightly inhomogeneous, nuclei resonate at slightly different frequencies. Although immediately after an RF irradiation, the nuclei are all in phase, they soon lose coherence and the signal that is observed, decays. Any such loss of coherence shortens T2. Thus, the effects due to inhomogeneities in the external field produce a rapid decay characterized by the relaxation time T2.

Magnetic resonance has become an established method for producing an image of the internal structure of an object. Such methods have numerous applications particularly in medical diagnostic techniques. For example, the examination and diagnosis of possible internal derangements of the knee is one such application of magnetic resonance imaging techniques. Most magnetic resonance techniques for knee imaging use a two-dimensional (or "2D") acquisition with a spin-echo pulse sequence to provide T1, T2 and proton density weighted images of the knee in multiple planes, typically the sagittal (y-z) and coronal (x-z) planes. However, the selective excitation techniques used by conventional 2D methods is limited in the ability to obtain thin slices by the gradient strength of the system. Furthermore, obtaining images in non-orthogonal planes is often advantageous for proper medical diagnosis. However, to obtain images in a non-orthogonal plane, the use of 2 gradients rather than a single gradient is required to obtain a slice. Finally, oblique plane imaging of an object requires a corrected procedure after obtaining each gradient echo to keep the slices passing through the object being imaged.

As a result of the shortcomings of 2D methods, three dimensional (or "3D") acquisitions of magnetic resonance data has been used to produce thin slice, high resolution images. See, for example, the publications to Harms and Muschler, "Three-Dimensional MR Imaging of the Knee Using Surface Coils", *Journal of Computer Assisted Tomography;* 10(5): 773-777 (1986) and Sherry et al., (Spinal MR Imaging: Multiplanar Representation from a Single High Resolution 3D Acquisition", *Journal of Computer Assisted Tomography;* 11(5): 859-862 (1987); Robert L. Tyrrell, "Fast Three-dimensional MR Imaging of the Knee: Comparison with Arthroscopy", *Radiology;* 166: 865-872 (1988); Charles E. Spritzer, et al., "MR Imaging of the Knee: Preliminary Results with a 3DFT GRASS Pulse Sequence", *American Journal of Roentology;* 150: 597-603 (1987); Alan M. Haggar, et al., "Meniscal Abnormalities of the Knee: 3DFT Fast-Scan GRASS MR Imaging", *American Journal of Roentology;* 150: 1341-1344 (1988).

It has long been desired to suppress the imaging of fat and/or water when producing MR images in connection with the examination and diagnosis of abnormalities of the orbit, head and neck, bone marrow, liver, breast and soft tissue masses as well as the cervical spine, knees, ankles, elbows, shoulder, wrist, lower legs, hips, thighs, and pelvis. Fat suppression has been long desired for T1 weighted sequences because MR images of fat generally tends to be of a sufficiently high signal intensity that lesions in anatomical parts with large amounts of fat, or where fat and other soft tissues are intermixed may be obscured. For example, the female breast is approximately 89% fat. When an MR image of a breast is produced, the fat appears as a high intensity image. However, a breast tumor would also appear as high intensity images in an MR image. As a result, the identification of a tumor using an MR image is difficult. This difficult diagnostic situation can be made even worse with the use of paramagnetic contrast agents that increase the signal of enhancing lesions by T1 shortening. As a result, the high signal intensity from contrast enhancing lesions can be made invisible by surrounding high signal intensity fat.

For example, in our prior U.S. patent application Ser. No. 07/569,100 filed Aug. 17, 1990, a series of selective component suppressive RF pulses were generated to produce transverse magnetization in the components of an object other than the component being suppressed. To suppress the selected component, the selective component suppressive RF pulses consisted of a pair of back-to-back opposing RF pulses tuned to a specified frequency range which corresponds to the resonance frequency of the component to be suppressed. For example, if it was desired to suppress the fat component of a tissue sample having both fat and water components, the pair of back-to-back opposing RF pulses would be modulated with a carrier frequency of approximately 64 MHz, the resonance frequency of fat. As a result, the back-to-back opposing RF pulses would produce a net tip angle of zero degrees at the selected resonance frequency and there would be no net transverse magnetization of the fat component, thereby suppressing the imaging of that component. Conversely, since the water component would be off resonance, transverse magnetization of the water would envolve temporally, thereby providing for the generation of an echo from which an image of the non-suppressed components may be produced.

SUMMARY OF THE INVENTION

In one aspect, the present invention is of a method of producing a selective component enhanced image of an object. A uniform magnetic field is generated to magnetize the object and, once magnetized, a first preparatory pulse sequence which enhances the contrast of a first component of the object with respect to a second component of the object is generated. Next, an RF pulse sequence is generated to produce transverse magnetization in the second component of the object. First, second, and third changing magnetic fields are then generated, thereby producing a series of gradient echoes in response to the generated RF pulse sequence. A contrast enhanced image of the object may then be produced.

BRIEF DESCRIPTION OF THE DRAWINGS

The present invention may be better understood, and its numerous objects, features and advantages will become apparent to those skilled in the art by reference to the following drawings in which.

DETAILED DESCRIPTION

Figure 1:
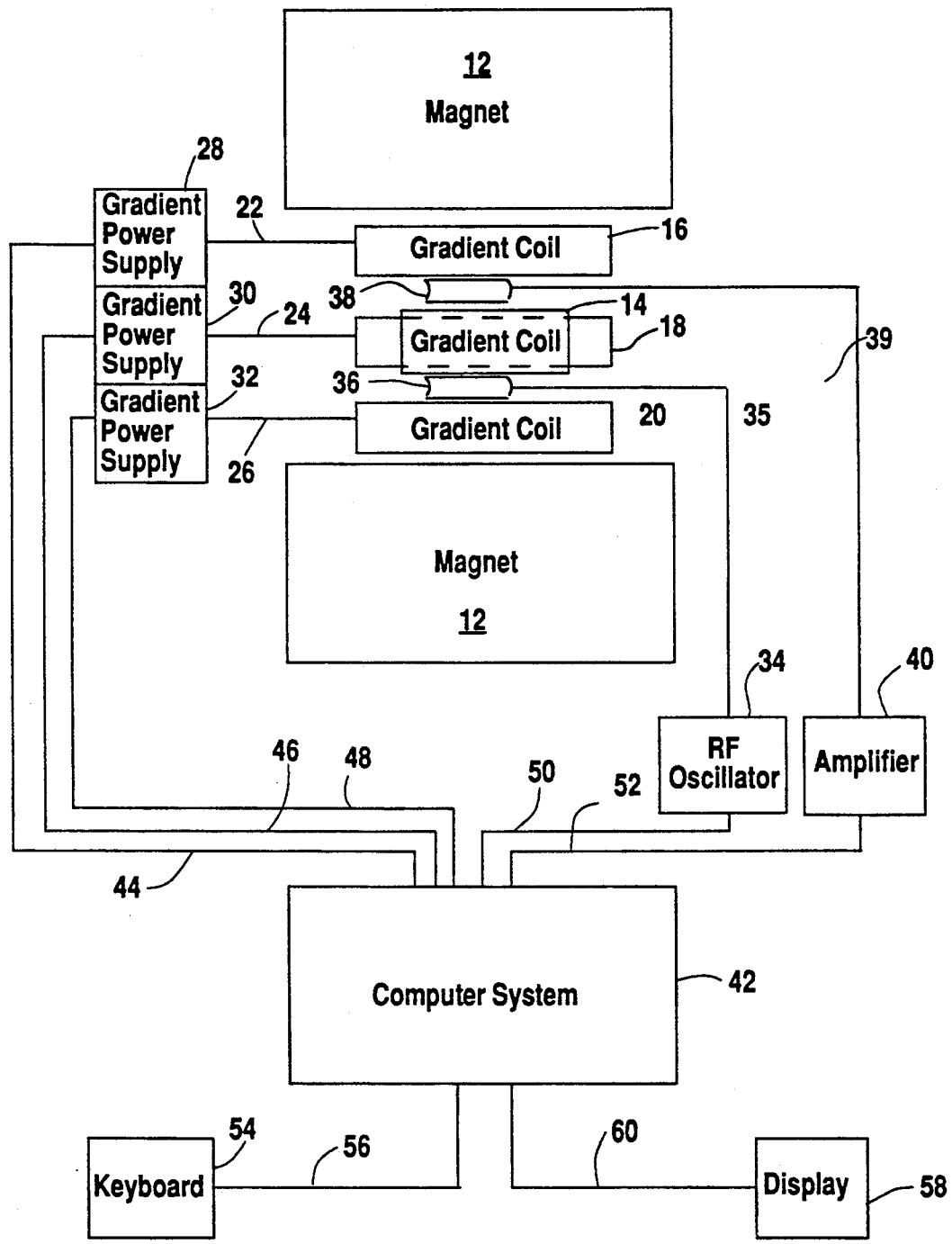
FIG. 1 is a block diagram of an apparatus for producing images of an object using magnetic resonance imaging techniques.

Referring first to FIG. 1, a magnetic resonance imaging system for use in conjunction with the teachings of the present invention shall now be described. As is well known in the art, magnetic resonance (or "MR") imaging requires a strong, uniform and stable magnetic field to magnetize the object being imaged. Accordingly, an MR imaging system 10 is provided with a magnetic 12, for example a superconducting magnet, for generating the aforementioned strong, uniform and stable magnetic field required for magnetizing an object 14 which is to be imaged. As magnetic imaging also requires rapidly changing weak magnetic field gradients along the x, y and z axis, the MR imaging system 10 is further provided with a first set of resistive or gradient coils 16 for generating a rapidly changing, weak magnetic field gradient along the x axis, a second set of gradient coils 18 for generating a rapidly changing, weak magnetic field gradient along the y axis, and a third set of gradient coils 20 for generating a rapidly changing, weak magnetic field gradient along the z axis. Each gradient coil set 16, 18, 20 may be, for example, two coils, each with currents flowing in a direction opposite to that in the other. Preferably, each gradient coil set 16, 18, 20 is configured to generate a gradient in a volume at the center of the coil set. The first, second and third gradient coil sets 16, 18, 20 are driven by a respective gradient power supply 28, 30, 32 connected to the corresponding gradient coil set 16, 18, 20 by an electrical connector 22, 24, 26, respectively, of conventional design. Preferably, each gradient coil subsystem 16, 22 and 28, 18, 24 and 30, 20, 26 and 32 should be configured to generate a 10 mT/m or greater gradient magnetic field controllable within precise limits with rise times of one msec or better.

As MR imaging further requires the generation of a radio frequency (or "RF") field to excite nuclear spins, the MR imaging system 10 further includes a low power RF oscillator 34 capable of amplitude and phase modulation as well as frequency changes required to meet imaging needs, an RF transmitter coil 36 which surrounds the object being imaged, and an RF receiver coil 38 which also surrounds the sample but which is orthogonal with respect to the RF transmitter coil 32. As the RF magnetic field generated by the RF transmitter coil 32 must be 90° to the main field generated by the magnet, the shape of the RF transmitter coil may be varied according to the direction of the main magnetic field with respect to the axis of the object 14. The RF oscillator 34 supplies RF power to the RF transmitter coil 36 via an electrical connector 35 where the RF magnetic field is transmitted into the object for exciting spins. Echoes are detected by the RF receiver coil 38, and transmitted via an electrical connector 39 to a low noise electronic amplifier 40 for digitization of the detected echoes. The RF field and echoes may be acquired using a Signa 1.5 Tesla imager manufactured by General Electric Medical Systems of Milwaukee, Wis. The imager is to be used typically in conjunction with a transmit-receive coil, also manufactured by General Electric Medical Systems, which is typically varied depending on the particular body area being imaged. For example, a quadrature head coil is to be used for cranial and foot examinations; a quadrature body coil is used for imaging of the thighs and pelvis; a linear transmit-receive extremity coil is preferably used in connection with the imaging of the knee, calf, ankle, arm and wrist; and receive-only surface coils are preferably used for the examination of the spine and shoulder.

The first, second and third gradient coil systems 16, 22 and 28, 18, 24 and 30, and 20, 26 and 32, as well as the RF transmitter coil 36 and RF receiver coil 38 are controlled by a computer system 42 via a corresponding electrical connector 44, 46, 48, 50 and 52, respectively. Typically, the computer system 36 will include a sequence control means for generating first, second and third voltage wave forms for transmission to the first, second and third gradient power supplies 28, 30 and 32 where first, second and third gradient magnetic pulse sequences corresponding to the voltage wave forms are produced for transmission by the first, second and third gradient coil sets 16, 18 and 20. The computer system 42 will further include means for generating an RF pulse sequence for transmission to the RF oscillator 34. Finally, the computer system 42 will also include data processing means for performing conventional data processing techniques such as Fourier transforms, data filtering and data storage functions. The computer system 42 is connected to an operator console 54, for example, a keyboard of conventional design, by an electrical connector 56 and display means 58, for example a CRT of conventional design, by an electrical connector 60. The operator of the console controls the production of an image of an object 14 through the computer system 42 as well as the display of the produced image by the display means 58. A computer system 42, operator console 54 and display means 58 which shall be satisfactory for the uses contemplated herein, may be provided by Model 3/260 workstation equipped with a TAAC accelerator manufactured by Sun Microsystems of Mountain View, Calif. Furthermore, if direct filming of the images displayed on the display means 58 are desired, a 35 mm camera may be used to photograph the displayed images.

Referring next to FIG. 2, the selective contrast enhancing, magnetic resonance imaging techniques subject of the present invention shall now be described in detail. As to be more fully described below, the selective contrast enhancing, magnetic resonance imaging techniques described herein may be generally characterized as generating a selective contrast enhancing preparatory pulse sequence applied prior to generating a sequence of RF and magnetic field gradient pulses in a manner such that the selective contrast enhancing preparatory pulse sequence modifies the gradient echo produced in response to the sequence of RF pulses and magnetic field gradient pulses (phase encoding pulses $G_{SL}$ and $G_{PH}$ and frequency encoding pulse $G_{RO}$) such that the intensity of certain signals of the image which correspond to certain components of the object are modified. Furthermore, by combining the selective contrast enhancing imaging techniques set forth herein, for example, the darkening of the image of water, with the selective component suppression imaging techniques also set forth herein, for example, the suppression of the fat component of an object, an improved imaging technique having superior diagnostic utility for the characterization of disease conditions such as pathologic processes and anatomic abnormalities has been developed.

Commencing at step 100, certain characteristics of the selective contrast enhancing preparatory pulse sequence and the sequence of RF and magnetic field gradient pulses are selected. Regarding the sequence of the RF and magnetic field gradient pulses, processing parameters $K_2$, $M_2$ and $N_2$ are selected. More specifically, $N_2$ is the number of phase encoding pulses $G_{PH}$ to be consecutively generated for each phase encoding pulse $G_{SL}$, $M_2$ is the number of phase encoding pulses $G_{SL}$ which are to be generated for each two dimensional slice necessary to produce a three dimensional image of the object 14 and $K_2$ is the number of two dimensional slices of the object 14 to be generated. Suitable parameters for the sequence of the RF and magnetic field gradient pulses are $N_2=128$, $M_2=128$ and $K_2=1,024$. These parameters would produce 16,384 echoes for each slice and, once assembled into a three dimensional image of the object 14, would correspond to a field of view of 20 cm for the object 14.

Regarding the selective contrast enhancing preparatory pulse sequence, it is specifically contemplated that a preparatory pulse sequence may be generated prior to each generation of the sequence of RF and magnetic field gradient pulses used to produce the series of gradient echoes corresponding to a two dimensional slice of the object 14 (the K-type preparatory pulse), or may be generated prior to the generation of each of the series of phase encoding pulses $G_{SL}$ generated for each slice (the L-type preparatory pulse), or may be generated prior to the generation of each of the series of phase encoding pulses $G_{PH}$ generated for each phase encoding pulse $G_{SL}$ (the M-type preparatory pulse) or for any combination of the K, L, and/or M-type preparatory pulse sequences. It is further contemplated that, for each type of preparatory pulse sequence, the sequence can consist of a single pulse pattern ($K_1$, $M_1$, and/or $N_1=1$) or multiple iterations of the single pulse pattern. Thus by also selecting $K_1$, $M_1$, and $N_1$ at step 100, the number of iterations of a pulse pattern for a preparatory pulse sequences may be determined.

Proceeding to step 110, set values for $L_{RF}$, $L_{SL}$ and $L_{PH}$ are selected based upon the preparatory pulse sequence selected. For example, for K, L, and/or M-type preparatory pulse sequences, $L_{RF}$, $L_{SL}$ and $L_{PH}$ should be set to "1" if the corresponding preparatory pulse sequence is selected and $L_{RF}$, $L_{SL}$ and $L_{PH}$ should be set to "0" if the corresponding preparatory pulse is not selected. Also at step 110, $G_{RF}$, $G_{SL}$ and $G_{PH}$, which count the number of slices completed, phase encoding pulse $G_{SL}$ pulse sequences generated for a slice, and phase encoding pulse $G_{PH}$ pulse sequences generated for a phase encoding pulse $G_{SL}$ pulse sequence, respectively, are each set to 1. Proceeding to step 120, the pre-RF pulse preparatory pulse sequence, the pre-phase encoding pulse $G_{SL}$ preparatory pulse sequence, and the pre-phase encoding pulse $G_{PH}$ preparatory pulse sequence are selected. As previously set forth, each of the respective preparatory pulse sequences may be any one, or a combination of multiple ones of a series of preparatory pulse sequences. The various preparatory pulse sequences contemplated for use in conjunction with the present invention shall be described with greater detail with respect to FIGS. 3a–f.

Assuming that the center of the object 14 being imaged is the origin of a Cartesian coordinate system, a static homogenous magnetic field directed along the z axis of the Cartesian coordinate system is generated at step 130 and, at step 140, a first pre-RF pulse preparatory pulse sequence is generated. The method of the present invention continues at step 150 and, at step 160, it is determined whether $L_{RF}$ is equal to $K_1$. If $L_{RF}$ is not equal to $K_1$, then $L_{RF}$ is incremented by one at step 170 and, at step 180, a next pre-RF pulse preparatory pulse sequence is generated. Proceeding to step 190, the method of the present invention returns to step 150 and continues to step 160, where it is again determined whether $L_{RF}$ is equal to $K_1$. If $L_{RF}$ is still not equal to $K_1$, steps 170, 180 and 190 repeat to generate additional next pre-RF pulse preparatory pulse sequences. This series of steps repeat until it is determined at step 160 that $L_{RF}$ equals $K_1$ and the generation of the pre-RF pulse preparatory pulse sequence is completed.

Proceeding now to step 200, a first pre-phase encoding pulse $G_{SL}$ preparatory pulse sequence is generated. The method of the present invention continues at step 210 and, at step 220, a determination is made as to whether $L_{SL}$ is equal to $M_1$. If $L_{SL}$ is not equal to $M_1$, then $L_{SL}$ is incremented by one at step 230 and, at step 240, a next pre-phase encoding pulse $G_{SL}$ preparatory pulse sequence is generated. Proceeding to step 250, the method of the present invention returns to step 210 and continues to step 220, where it is again determined whether $L_{SL}$ is equal to $M_1$. If $L_{SL}$ is still not equal to $M_1$, steps 230, 240 and 250 repeat to generate additional next phase encoding pulse $G_{SL}$ preparatory pulse sequences. This series of steps repeat until it is determined at step 220 that $L_{SL}$ equals $M_1$ and the generation of the pre-phase encoding pulse $G_{SL}$ preparatory pulse sequence is completed.

Proceeding now to step 260, a first pre-phase encoding pulse $G_{PH}$ preparatory pulse sequence is generated. The method of the present invention continues at step 270 and, at step 280, it is determined whether $L_{PH}$ is equal to $N_1$. If $L_{PH}$ is not equal to $N_1$, then $L_{PH}$ is incremented by one at step 290 and, at step 300, a next pre-phase encoding pulse $G_{PH}$ preparatory pulse sequence is generated. Proceeding to step 310, the method of the present invention returns to step 270 and continues to step 280, where it is again determined whether $L_{PH}$ is equal to $N_1$. If $L_{PH}$ is still not equal to $N_1$, steps 290, 300, and 310 repeat to generate additional next phase encoding pulse $G_{PH}$ preparatory pulse sequences. This series of steps repeat until it is determined at step 280 that $L_{PH}$ equals $N_1$ and the generation of the pre-phase encoding pulse $G_{PH}$ preparatory pulse sequence is completed.

Proceeding to step 320, an RF pulse sequence is applied to generate transverse magnetism. More specifically, the RF transmitter coil 36 creates transverse magnetism by evolving a first RF magnetic field pulse sequence in the absence of additional magnetic field gradients and in the presence of the uniform magnetic field. In accordance with one embodiment of the invention and exclusive of the preparatory pulse sequence's selective enhancement of contrast, the RF pulse sequence suppresses a selected component, while minimizing the generation of artifacts, by being comprised of a pair of back-to-back opposing RF pulses tuned to a specified frequency range which corresponds to the resonance frequency of the component to be suppressed. By using back-to-back opposing RF pulses, artifacts which would result due to interference between the RF echo and the gradient echo are avoided. For example, if it is desired to suppress the fat component during a low artifact imaging of a tissue sample having both fat and water components, the pair of back-to-back opposing RF pulses will be modulated with a carrier frequency of approximately 64 MHz, the resonance frequency of fat. As a result, the back-to-back opposing RF pulses will produce a net tip angle of zero degrees at the selected resonance frequency and there will be no net transverse magnetization of the fat component, thereby suppressing the imaging of that component. Conversely, since the water component will be off resonance, transverse magnetization of the water component will evolve temporally, thereby providing for the generation of an echo from which an image of the non-suppressed components may be produced. In one embodiment of the invention, the applied RF pulse sequence may be comprised of back-to-back non-selective opposing adiabatic half frequency pulses of short duration, for example, 200 microseconds, generated in the absence of a slice selective gradient and having a repetition time $T_R$ of 20 milliseconds between successive pulses.

Proceeding to step 330, gradient magnetic fields are generated along the z, as well as the x and y, axes of the Cartesian coordinate system. As to be more fully described herein, the generated gradient magnetic fields are a first phase encoding gradient magnetic field directed along the x axis which is hereafter referred to as the $G_{SL}$ gradient magnetic field, a frequency encoding gradient magnetic field directed along the y axis which is hereafter referred to as the $G_{RO}$ gradient magnetic field, and a second phase encoding gradient magnetic field directed along the z axis which is hereafter referred to as the $G_{PH}$ gradient magnetic field. More specifically, a first phase encoding pulse $G_{SL-1}$ along the slice axis and a first phase encoding pulse $G_{PH-1}$ along the phase axis are generated as part of the $G_{SL}$ and $G_{PH}$ gradients to be more fully described with respect to FIG. 3. The first phase encoding pulses $G_{SL-1}$ and $G_{PH-1}$ correspond to the application of the phase encoding gradients full force in a positive direction along the slice and phase axes, respectively.

During the generation of the phase encoding pulses $G_{SL-1}$ and $G_{PH-1}$, the $G_{RO}$ frequency encoding pulse is negative, thereby dephasing the spins. At step 340, the $G_{RO}$ frequency encoding pulse goes positive, thereby permitting the acquisition of a component suppressed gradient echo for the first phase encoding pulses $G_{SL-1}$ and $G_{PH-1}$ at step 340 and, at step 350, the acquisition of a first contrast enhanced gradient echo, most typically with an echo time on the order of 2.8 to 3.2 msec., by the RF receiver coil 34 is completed.

Proceeding to step 360, it is then determined whether the immediately previous generated phase-encoding pulse is the $N_2$ phase-encoding pulse generated for $M_2 = 1$. If it is determined at step 360 that the immediately previous generated phase-encoding pulse is not the $N_2$ generated pulse for $M_2 = 1$, $G_{PH}$ is incremented by one at step 370 and, at step 380, $L_{PH}$ is reset to one if a pre-phase encoding pulse $G_{PH}$ preparatory pulse sequence was previously selected. Proceeding to step 390, the first pre-phase encoding pulse $G_{PH}$ preparatory pulse sequence is again generated and, at step 400, the method subject of the present invention returns to step 270 for further processing.

Having returned to step 270, the pre-phase encoding pulse $G_{PH}$ preparatory pulse sequence repeats in a manner identical to that described above and, after generation of the next pre-phase encoding pulse $G_{PH}$ preparatory pulse sequence, the method of the present invention continues to step 320 where steps 320, 330, 340 and 350 are repeated so that a second component enhanced gradient echo is acquired. For this next acquired echo, $G_{SL}$ is the same but $G_{PH}$ has changed. Again proceeding to step 360, if $G_{PH}$ is still not equal to $N_2$, a series of pre-phase encoding pulse $G_{PH}$ preparatory pulse sequences followed by the generation of a next component enhanced gradient echo is acquired, each successive gradient echo generated with phase encoding gradients applied with successively less strength until, during the middle phase encoding pulses, the phase encoding gradients are turned off and during the last phase encoding pulses, the phase encoding gradients are applied full force in a negative direction along the slice and phase axes, respectively.

Once $K_1$ gradient echoes have been acquired, the method subject of the present invention continues to step 410 where it is determined whether $G_{SL}$ is equal to $M_2$. If $G_{SL}$ is less than $M_2$, then $G_{SL}$ is incremented by one at step 420 and, at step 430, $L_{SL}$ is reset to one if pre-phase encoding pulse $G_{SL}$ preparatory pulse sequence was previously selected. Proceeding to step 440, the first pre-phase encoding pulse $G_{SL}$ preparatory pulse sequence is generated again and, at step 450, the method subject of the present invention returns to step 210 where, the pre-phase encoding pulse $G_{SL}$ preparatory pulse sequence set forth in steps 220, 230, 240, and 250 is repeated if the pre-phase encoding pulse $G_{SL}$ preparatory pulse sequence includes more than one repetition of the pulse sequence.

Once the pre-phase encoding pulse $G_{SL}$ preparatory pulse sequence has been fully generated an additional time, $G_{SL}$ will again equal $M_1$ and the method proceeds to step 260 where, the first pre-phase encoding pulse $G_{PH}$ preparatory pulse sequence is generated again if it was previously selected. If the pre-phase encoding pulse $G_{PH}$ preparatory pulse sequence is a multiple pulse sequence, steps 280, 290, 300, and 310 are repeated until the pre-phase encoding pulse $G_{PH}$ preparatory pulse sequence is reproduced. The method of the present invention then proceeds to step 320 where a next series of selective component enhanced gradient echoes are acquired for a next value of $G_{SH}$ and $G_{PH}$ from 1 to $N_2$. As before, each pre-phase encoding pulse $G_{PH}$ preparatory pulse sequence and each pre-phase encoding pulse $G_{SL}$ are provided in the same manner as before. This series of selective component enhanced gradient echoes are repeatedly acquired for each successive gradient echo generated with phase encoding gradient $G_{SL}$ applied with successively less strength until, during the middle phase encoding pulses, the phase encoding gradients are turned off and during the last phase encoding pulses, the phase encoding gradients are applied full force in a negative direction along the slice and phase axes, respectively. Having acquired $N_2$ echoes for $G_{SL}$ from one to $M_2$ (for a total of $M_2$ times $N_2$ selective component enhanced gradient echoes), at step 410, $G_{SL}$ is determined to be equal to $M_2$ and the method of the subject invention proceeds to step 460 where it is determined whether $G_{RF}$ is equal to $K_2$. Proceeding to step 470, $L_{RF}$ is reset to one if a pre-RF pulse preparatory pulse sequence was previously selected. Proceeding to step 480, a first pre-RF preparatory pulse sequence is generated and, at step 490, the method subject of the present invention continues to step 150 for further processing.

At step 150, the method subject of the present invention will proceed to step 200 if the pre-RF pulse preparatory pulse sequence consists of a single pulse sequence or will loop through steps 160, 170, 180, and 190 if the pre-RF pulse preparatory pulse sequence consists of a multiple pulse sequence. Single or multiple pulse sequences of the pre-phase encoding pulse $G_{SL}$ and $G_{PH}$ pulse sequences will then be produced by passes through the respective pre-phase encoding pulse preparatory pulse sequence algorithms. Continuing on to step 320, a next group of ($M_2$ times $N_2$) selective component enhanced gradient echoes are then acquired in a manner identical to that described above except that $G_{RF}$ will now be equal to 2. Once the next group of selective component enhanced gradient echoes have been acquired, thereby acquiring the echoes for a second slice, the method subject of the present invention repeats the above acquisition of $M_2$ times $N_2$ echoes for each slice $G_{RF}$ through GRF equals K2. Once $G_{RF}$ equals $K_2$, the method subject of the present invention proceeds from step 460 to step 500 and the last selective component enhanced gradient echo has been acquired. Proceeding to step 510, processing of the acquired data commences. Typically, the acquired data may be viewed as a matrix of dimensions $128 \times 128 \times 1024$. This viewing matrix corresponds to a field of view of 20 cm. At step 520, therefore, the acquired data matrix is processed to determine the signal intensity at each location, thereby producing an image of the object by the application of well known Fourier transform data processing techniques. Accordingly, the data matrix is transformed into a series of frequency data views in the frequency domain by applying a first series of Fourier transforms in the time direction. At step 530, an image of the object is produced by applying a second and third series of Fourier transforms in the slice phase encode direction and in the phase encode direction. Preferably, the frequency domain should be oversampled to avoid aliasing data.

Figure 2A:
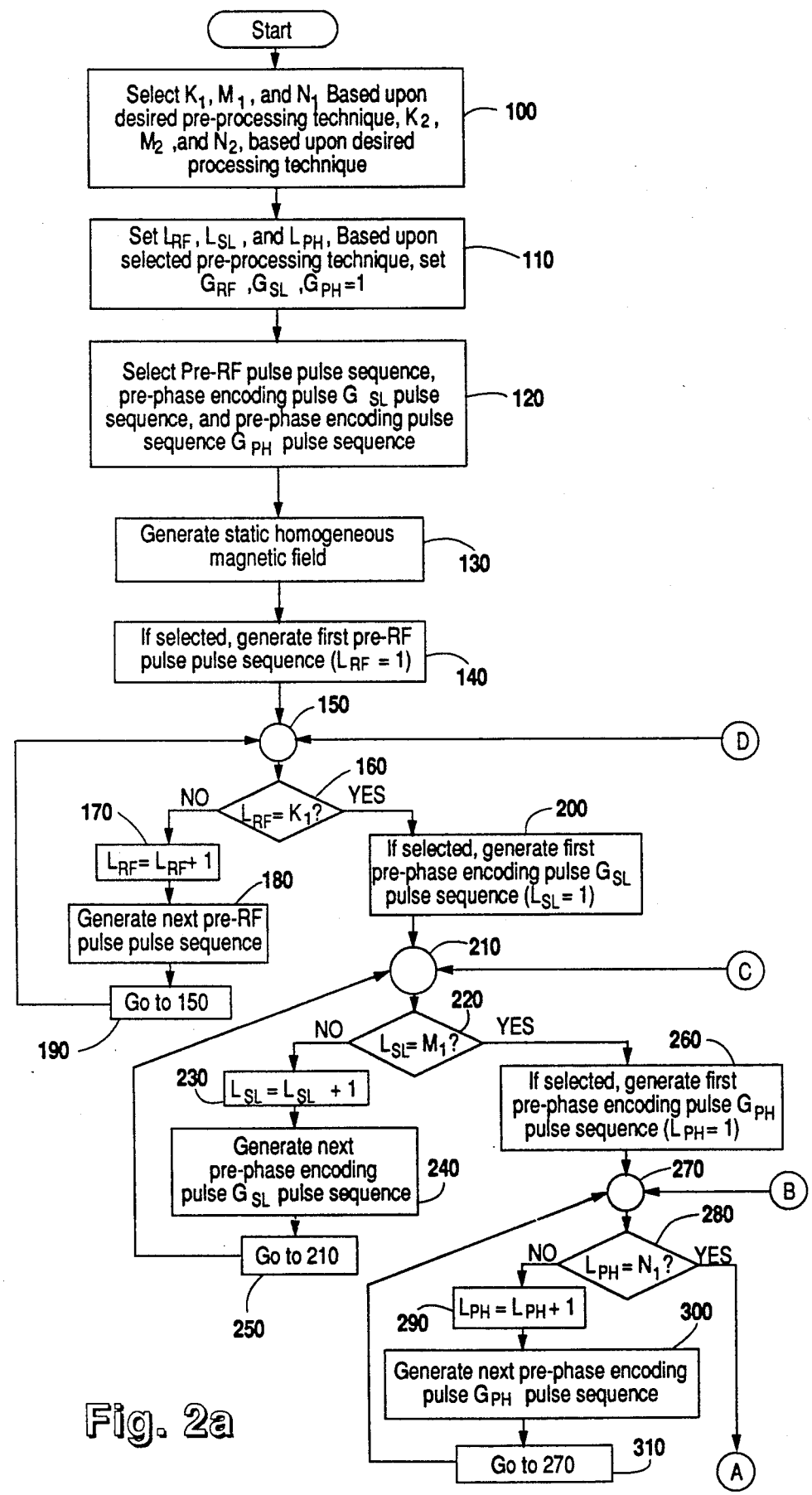
FIGS. 2a-b is a flow chart of a selective component enhancing, magnetic resonance imaging technique subject of the present invention.
Figure 2B:
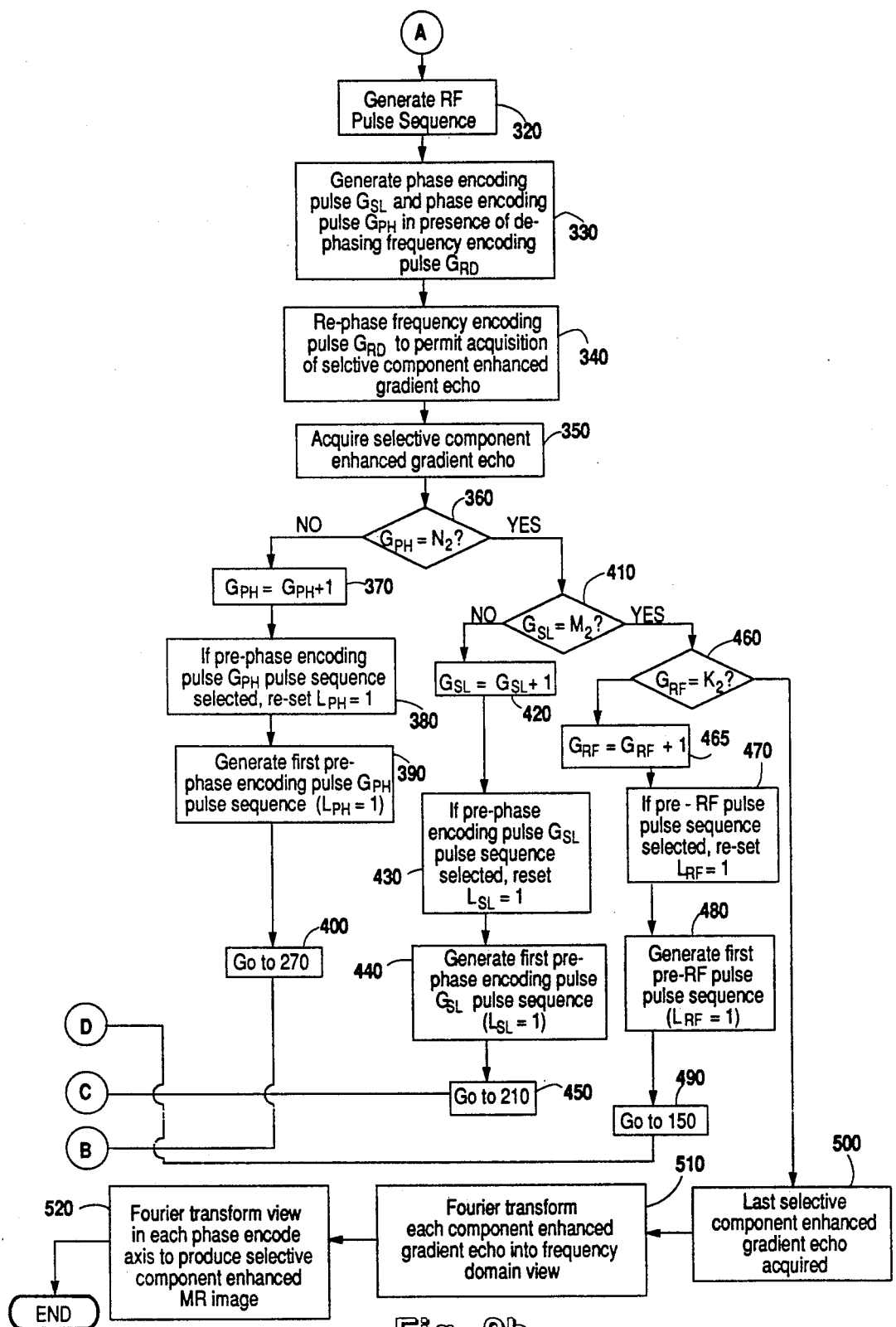
Figure 3A:
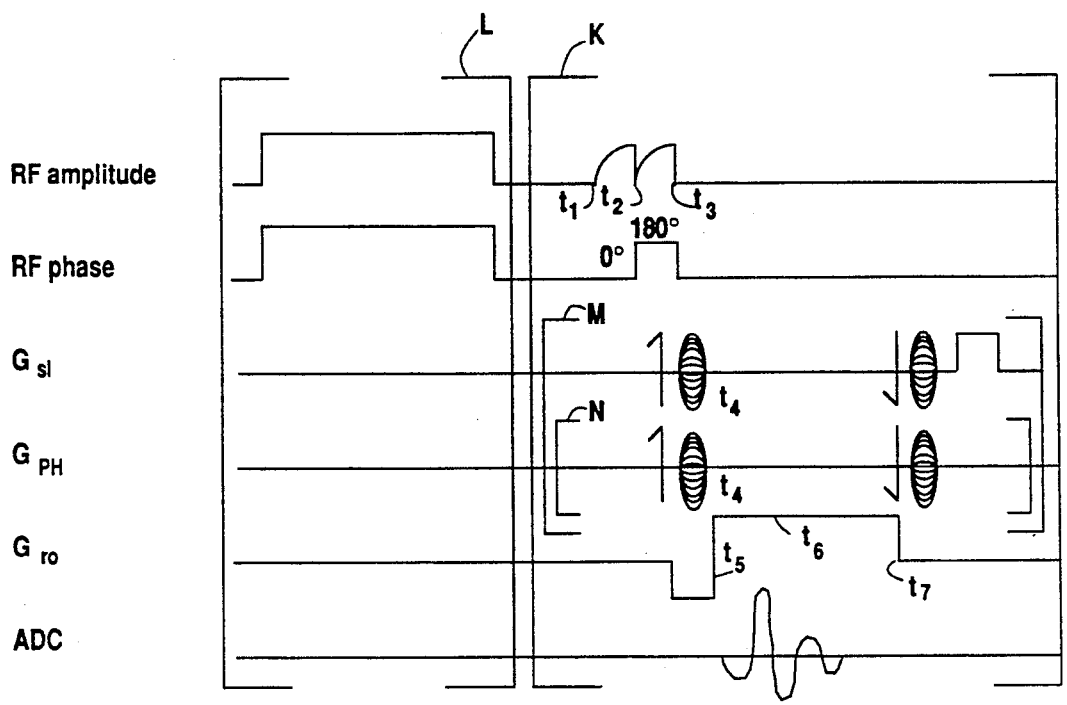
FIG. 3a is a schematic diagram of a first embodiment of a selective contrast enhancing pulse sequence produced in accordance with the selective contrast enhancing, magnetic resonance imaging technique of FIGS. 2a-c.

Referring next to FIG. 3a, a first embodiment of a selective contrast enhancing pulse sequence produced in accordance with the selective contrast enhancing, magnetic resonance imaging technique of FIGS. 2a-b shall now be described in greater detail. More specifically, the selective contrast enhancing pulse sequence illustrated herein includes a preparatory pulse sequence which saturates certain resonances associated with water. In this manner, the preparatory pulse sequence reduces the signal of water, thereby darkening the image produced from the acquired echoes. In particular, by obtaining an image of an object using the selective contrast enhancing pulse sequence illustrated herein following the administration of the contrast agent gadolinium diethylentriamine pentaacetic acid, the preparatory pulse would darken the image of the $T_1$ saturated water while the faster $T_1$ recovery time of gadolinium will cause the vascularized anatomy in which gadolinium tends to accumulate in, to appear brighter, thereby resulting in the improved identification of tumors and masses, most notably, tumors and masses in the human breast.

Addressing now the pulse sequence illustrated in FIG. 3a in detail, a preparatory pulse located off resonance from the primary water signal may be seen within brackets L. While illustrated in the shape of a relatively long pulse of constant amplitude, the preparatory pulse may be in other shapes so long as the profile of the frequency response has a null at the frequency of water. For example, a polynomial pulse or a sinc pulse would produce the desired result as well. Furthermore, while a single preparatory pulse L is illustrated, it is contemplated that a preparatory pulse may be generated prior to the generation of each different magnetic phase encoding pulse $G_{PH}$, and/or each different magnetic phase encoding pulse $G_{SL}$, and/or each different object slice imaged. In addition, while FIG. 3a illustrates a preparatory pulse which is comprised of a single repetition of the pulse sequence within brackets L, it is further contemplated that the pulse sequence may include multiple repetitions of the preparatory pulse and/or different preparatory pulse sequences prior to the portions of the pulse sequence set forth within brackets K, M, and/or N, respectively.

After generation of a preparatory pulse such as the pulse L, a pair of RF pulses are generated in the absence of a slice-selective excitation gradient. More specifically, at time $t_1$, a first RF pulse, preferably an adiabatic half passage pulse, is generated for 200 microseconds at a first RF phase angle. At time $t_2$, the generation of the first RF pulse is complete and the generation of a second RF pulse, identical to the first RF pulse and of opposite phase is commenced. At time $t_3$, the generation of the second RF pulse is completed. Since the twenty degree adiabatic half passage pulses are preferably tuned to a frequency range, most typically the frequency range corresponding to the resonant frequency of fat, the pulses produce a net tip angle of zero degrees, thereby suppressing the fat component of the object being imaged. Since other components of the object, in the present example, water, does not have the same resonant frequency as fat, the RF pulses are additive, thereby producing transverse magnetization which excites the water component of the object. However, the preparatory pulse tends to suppress the image of water due to its null response at the frequency of water. As a result, the imaging technique which includes the generation of the selective contrast enhancing pulse sequence illustrated in FIG. 3a for darkening the water component and suppressing the fat component of an object has been utilized to obtain three dimensional images of the breast prior and following the administration of the contrast agent gadolinium diethylenetriamine pentaacetic acid. Specifically, the use of this imaging technique has improved the diagnostic utility of such images for the identification of tumors and masses in the human breast. Furthermore, the use of this imaging technique has been utilized for the production of improved MR angiographic images from the human body. The reduction in signal intensity from fat and normal tissue possible using the techniques set forth herein can be combined with administration of the contrast agent gadolinium diethylenetriamine pentaacetic acid to produce improved MR angiographic images of the knee, breast, extremities, and brain.

Figure 3B:
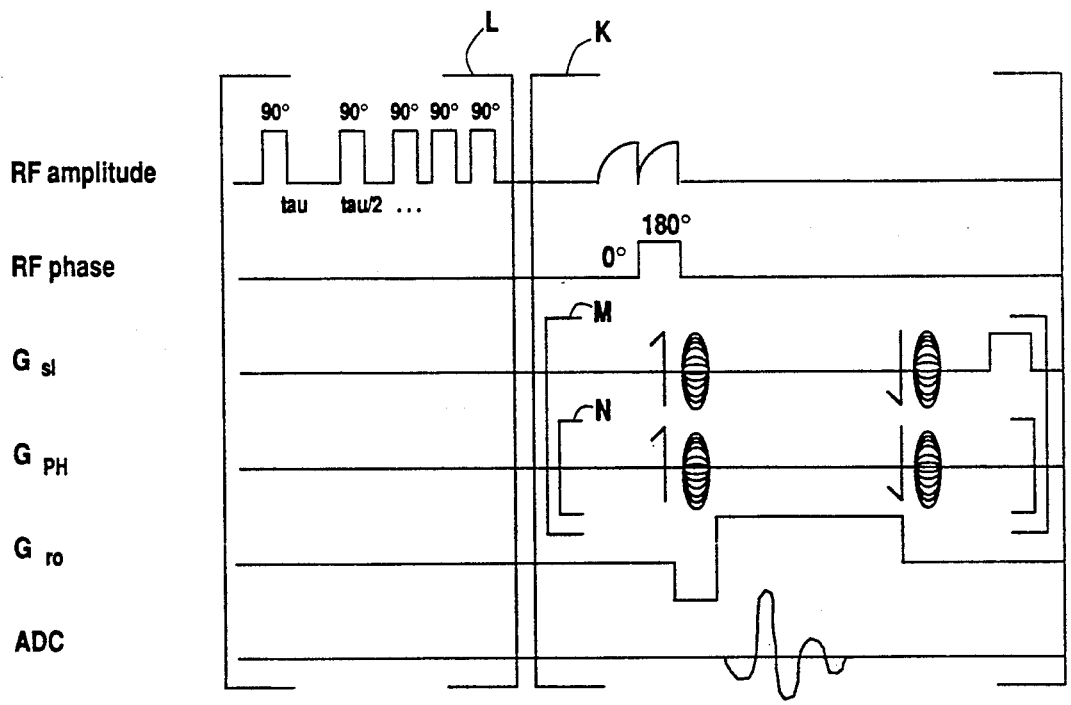
FIG. 3b is a schematic diagram of a second embodiment of a selective contrast enhancing pulse sequence produced in accordance with the selective contrast enhancing, magnetic resonance imaging technique of FIGS. 2a-c.

Referring next to FIG. 3b, the pulse sequence illustrated herein is identical to that illustrated in FIG. 3a except for the modification of the preparatory pulse located within bracket L. Like the preparatory pulse illustrated in FIG. 3a, the series of preparatory pulses illustrated in FIG. 3b is designed to reduce the strength of the water signal, here by saturating the magnetization from the water prior to the acquisition of the image, thereby darkening the image of the water and making the contrast agent gadolinium diethylentriamine pentaacetic acid become more readily distinguishable when the image is produced. The preparatory pulse sequence is comprised of a series of 90 degree RF pulses. In alternate embodiments of the invention, the series of RF pulses are evenly spaced in time such that the residual longitudinal magnetization component is zero at the beginning of the imaging sequence, or unevenly spaced in time, which would destroy coherence and lengthen the recovery period for the longer $T_1$ signals. Again, by combining the selective contrast enhancement techniques herein discussed to darken the produced image of water and the component suppression techniques set forth herein to suppress the imaging of fat, it is contemplated that improved $T_1$ weighted MR images of the knee, extremities, brain, and breast shall be produced.

Figure 3C:
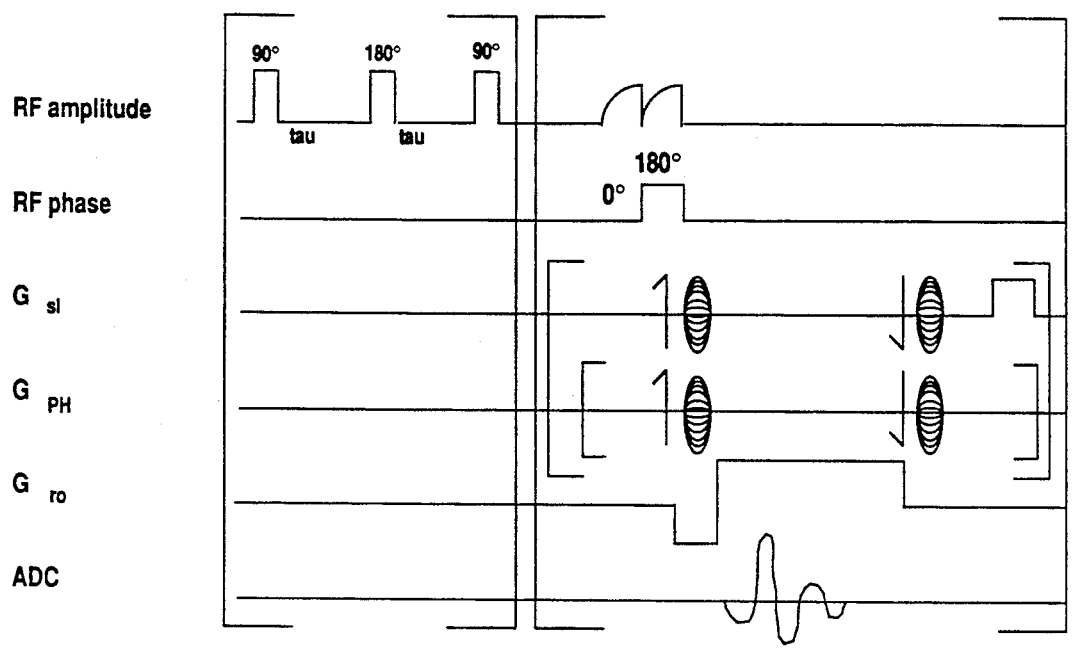
FIG. 3c is a schematic diagram of a third embodiment of a selective contrast enhancing pulse sequence produced in accordance with the selective contrast enhancing, magnetic resonance imaging technique of FIGS. 2a-c.

Referring next to FIG. 3c, the pulse sequence illustrated herein is identical to those illustrated in FIGS. 3a-b except for yet another modification of the preparatory pulse within bracket L. Here, the preparatory pulse sequence is comprised of a series of RF pulses for selectively destroying the coherence of magnetization components with either long or short transverse relaxation times. For example, FIG. 3c illustrates a series of three RF pulses of the form (pi)/2—(tau)—(pi)—(tau)—(--pi)/2 where tau is a short time delay which allows transverse relaxation to occur. It is contemplated that improved $T_2$ weighted images of the knee, extremities, brain, and breast may be produced by utilizing the selective contrast enhancement techniques illustrated in FIG. 3c as compared to images produced utilizing the selective component suppression imaging techniques also set forth herein.

Figure 3D:
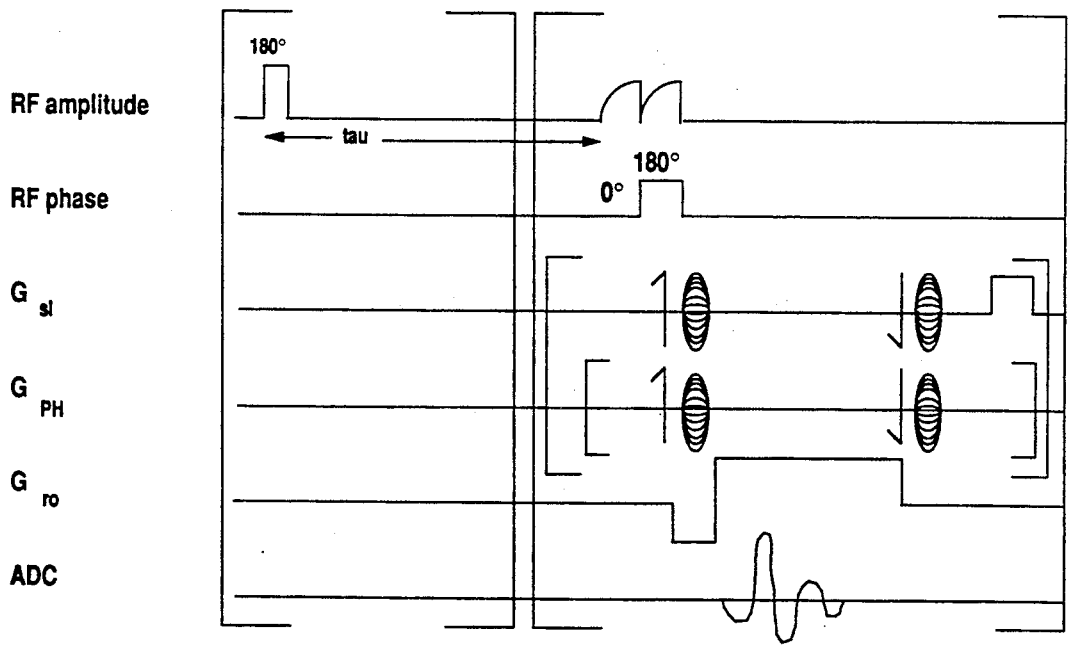
FIG. 3d is a schematic diagram of a fourth embodiment of a selective contrast enhancing pulse sequence produced in accordance with the selective contrast enhancing, magnetic resonance imaging technique of FIGS. 2a-c.

Referring next to FIG. 3d, the pulse sequence illustrated herein is identical to those illustrated in FIGS. 3a-c except for yet another modification of the preparatory pulse within bracket L. Here, a selective (pi) pulse of hyperbolic form inverts the magnetization from water. While $T_1$ begins to recover shortly thereafter, $T_1$ has been sufficiently reduced such that the image of water produced thereafter is darker. Again, by combining the selective contrast enhancement techniques herein discussed to darken the produced image of water and the component suppression techniques set forth herein to suppress the imaging of fat, it is contemplated that improved $T_1$ weighted MR images of the knee, extremities, brain, and breast shall be produced.

Figure 3E:
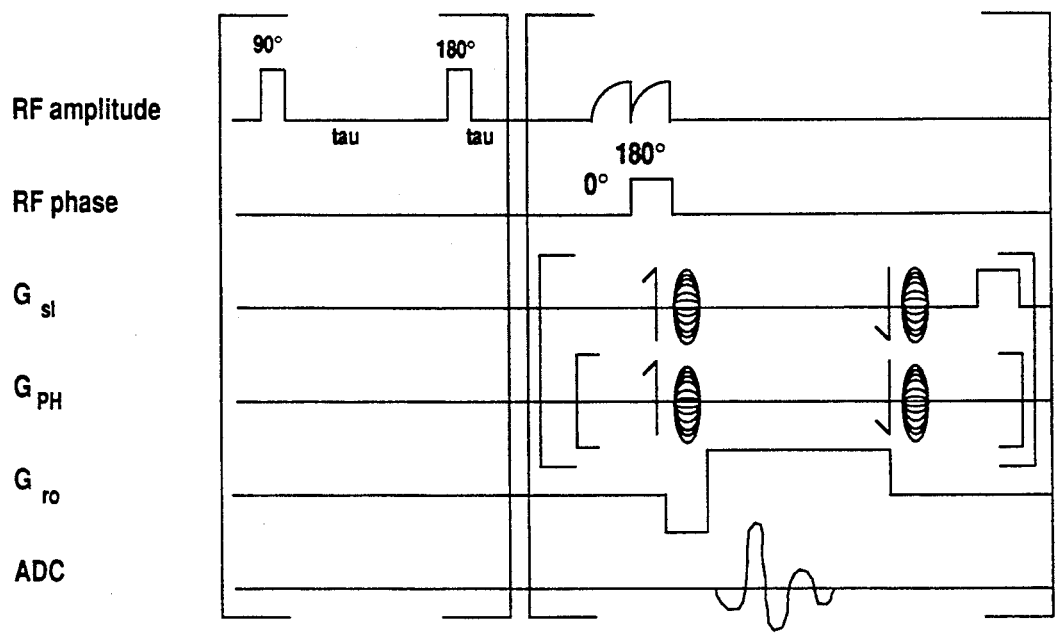
FIG. 3e is a schematic diagram of a fifth embodiment of a selective contrast enhancing pulse sequence produced in accordance with the selective contrast enhancing, magnetic resonance imaging technique of FIGS. 2a-c.

Referring next to FIG. 3e, the pulse sequence illustrated herein is identical to those illustrated in FIGS. 3a-d except for yet another modification of the preparatory pulse within bracket L. Here, the preparatory pulse sequence is comprised of a pair of RF pulses of the form (pi)/2—(tau)—(pi)—(tau) where (tau) is a long delay such that transverse magnetization is dephased and longitudinal relaxation occurs. Again, by combining the selective contrast enhancement techniques herein discussed to darken the produced image of water and the component suppression techniques set forth herein to suppress the imaging of fat, it is contemplated that improved $T_1$ weighted MR images of the knee, extremities, brain, and breast shall be produced.

Figure 3F:
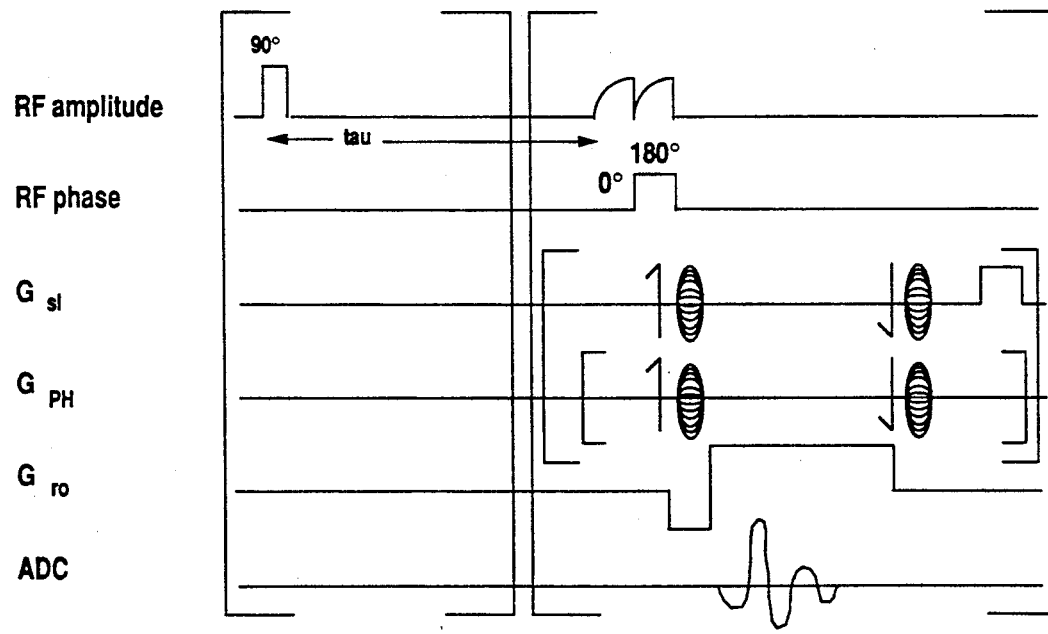
FIG. 3f is a schematic diagram of a sixth embodiment of a selective contrast enhancing pulse sequence produced in accordance with the selective contrast enhancing, magnetic resonance imaging technique of FIGS. 2a-c.

Referring next to FIG. 3f, the pulse sequence illustrated herein is identical to those illustrated in FIGS. 3a-e except for yet another modification of the preparatory pulse within bracket L. Here, the preparatory pulse sequence is comprised of a single ninety degree pulse which selectively excites the signal from the water.

As can be seen from the above description of the present invention, set forth herein are numerous improved methods for imaging an object using selective contrast enhancement techniques, in particular, techniques for the selective contrast enhancement of water within an object. Furthermore, by combining these techniques with selective component suppression techniques also set forth herein, in particular, techniques for suppressing the fat component in an object, imaging techniques still further improved are provided.

However, those skilled in the art will recognize that many modifications and variations besides those specifically mentioned may be made in the techniques described herein without departing substantially form the concept of the present invention. Accordingly, it should be clearly understood that the form of the invention described herein is exemplary only and is not intended as a limitation on the scope of the invention.

What is claimed is:

1. A method of producing a selective component enhanced image of an object comprised of at least first and second components, comprising the steps of:

generating a uniform magnetic field to magnetize said object;

generating a first preparatory pulse sequence to enhance the contrast of said first component with respect to said second component;

generating an RF pulse sequence to produce transverse magnetization in said second component of said object;

generating first, second, and third changing magnetic fields in said object;

receiving a series of gradient echoes in response to said generated RF pulse sequence; and producing a contrast enhanced image of said object.

2. A method of producing a selective component enhanced image of an object according to claim 1 wherein said object further comprises a third component and wherein the step of generating an RF pulse sequence to produce transverse magnetization in said second component of said object further comprises the step of generating a selective component suppressive RF pulse sequence, said selective component suppressive RF pulse sequence suppressing the imaging of said second component.

3. A method of producing a selective component enhanced image of an object according to claim 2 wherein the step of generating a selective component suppressive RF pulse sequence further comprises the step of generating a series of back-to-back selective component suppressive RF pulses.

4. A method of producing a selective component enhanced image of an object according to claim 3 wherein the step of generating said series of back-to-back selective component suppressive RF pulses further comprises the steps of:

generating a first selective component suppressive RF pulse, said first RF pulse having an amplitude and a phase; and immediately generating a second selective component suppressive RF pulse after completing the generation of said first RF pulse, said second RF pulse produced by shifting said phase by approximately 180 degrees.

* * * * *